(12) United States Patent
Mehrl et al.

(10) Patent No.: US 10,423,849 B2
(45) Date of Patent: Sep. 24, 2019

(54) ARRANGEMENT OF AN APERTURE AND A FILTER REGION FOR A FILTER SENSOR DEVICE AND FILTER SENSOR DEVICE

(71) Applicant: ams AG, Unterpremstaetten (AT)

(72) Inventors: David Mehrl, Plano, TX (US); George Kelly, McKinney, TX (US)

(73) Assignee: ams AG, Unterpremstaetten (AT)

( * ) Notice: Subject to any disclaimer, the term of this patent is extended or adjusted under 35 U.S.C. 154(b) by 9 days.

(21) Appl. No.: 15/586,192

(22) Filed: May 3, 2017

(65) Prior Publication Data

US 2017/0323171 A1   Nov. 9, 2017

Related U.S. Application Data

(60) Provisional application No. 62/331,674, filed on May 4, 2016.

(30) Foreign Application Priority Data

Jun. 10, 2016   (EP) .................................... 16174001

(51) Int. Cl.
*G06K 9/20* (2006.01)
*G02B 5/20* (2006.01)
(Continued)

(52) U.S. Cl.
CPC ............ *G06K 9/209* (2013.01); *G01J 1/0437* (2013.01); *G01J 1/0492* (2013.01); *G01J 3/0229* (2013.01);
(Continued)

(58) Field of Classification Search
CPC .......... G02B 5/208; G02B 1/04; G02B 5/282; G02B 5/26; G02B 5/223; G02B 5/0891; G02B 5/0816; G02B 1/14; G02B 5/283; G02B 5/281; G02B 5/22; G02B 5/201; G02B 5/285; G02B 1/10; G02B 1/11; G02B 5/206; G02B 5/0841; G02B 5/287; B32B 7/02; B32B 27/08; B32B 17/10; B32B 2307/412; B32B 2307/416; B32B 2367/00; B32B 2419/00; B32B 2264/102; B32B 2307/418; B32B 27/20; B32B 27/306;
(Continued)

(56) References Cited

U.S. PATENT DOCUMENTS 9,071,721 B1 *   6/2015   D'Amico ............... H04N 9/045
9,217,671 B2    12/2015   Gommans et al.
(Continued)

FOREIGN PATENT DOCUMENTS

WO   2010081556 A1   7/2010
WO   2016005097 A1   1/2016

*Primary Examiner* — Evan P Dzierzynski
*Assistant Examiner* — Sharrief I Broome
(74) *Attorney, Agent, or Firm* — Fish & Richardson P.C.

(57) ABSTRACT

The arrangement comprises a filter region (10) filtering electromagnetic radiation and a shielding component (20) inhibiting propagation of electromagnetic radiation. The filter region comprises a central filter region (11) and a separate peripheral filter region (13). The shielding component comprises an aperture (21). The aperture is arranged above the central filter region. The central filter region and the peripheral filter region are optimized for different angles of incidence ($\alpha$, $\beta$) and provided for measurements by individual sensor regions (18, 19).

22 Claims, 4 Drawing Sheets

(51) Int. Cl.
  *G02B 5/28* (2006.01)
  *G02B 13/14* (2006.01)
  *H04N 5/33* (2006.01)
  *G01J 3/51* (2006.01)
  *G01J 1/04* (2006.01)
  *G01J 3/02* (2006.01)
  *H01L 27/144* (2006.01)
  *H01L 27/146* (2006.01)
  *G01J 3/12* (2006.01)

(52) U.S. Cl.
  CPC ......... *G01J 3/0259* (2013.01); *G01J 3/0289* (2013.01); *G01J 3/513* (2013.01); *G02B 5/204* (2013.01); *G02B 5/208* (2013.01); *G02B 5/281* (2013.01); *G02B 13/146* (2013.01); *H01L 27/1446* (2013.01); *H01L 27/14621* (2013.01); *H01L 27/14649* (2013.01); *H04N 5/33* (2013.01); *G01J 2003/1213* (2013.01)

(58) Field of Classification Search
  CPC ...... B32B 17/10036; B32B 2307/4026; B32B 2551/00; B32B 27/18; B32B 17/106
  USPC .................................................. 359/507–888
  See application file for complete search history.

(56) References Cited

U.S. PATENT DOCUMENTS

| | | | |
|---|---|---|---|
| 2005/0030659 A1* | 2/2005 | Asakawa | G02B 26/008 359/892 |
| 2005/0146634 A1* | 7/2005 | Silverstein | H04N 5/2254 348/360 |
| 2010/0265375 A1 | 10/2010 | Yukawa | |
| 2011/0115964 A1* | 5/2011 | Gere | G02B 5/20 348/342 |
| 2013/0215238 A1 | 8/2013 | Yamazaki | |
| 2015/0260888 A1 | 9/2015 | Yoshihara et al. | |

\* cited by examiner

ARRANGEMENT OF AN APERTURE AND A FILTER REGION FOR A FILTER SENSOR DEVICE AND FILTER SENSOR DEVICE

BACKGROUND OF THE INVENTION

Optical sensor devices comprise sensor elements like photodiodes. Filters are placed above the sensor elements for the purpose of selecting spectral ranges. Optical interference filters are formed by successive layers of different optical materials of distinct refractive indexes. The spectral response, which is represented by the wavelength filter curve, can be adjusted by controlling the thickness of the filter layers. Such interference filters are rather sensitive to the angle of incidence.

The transition wavelength of the filter tends to shift to progressively shorter wavelengths with increasing angle of incidence. Hence the color measurement depends on the angle of incidence. This effect may also adversely affect the computation of derived quantities like color temperature.

WO 2016/005097 A1 discloses an optoelectronic package with lens assembly comprising a lens having an upper surface, a lateral surface surrounding the lens, and a bottom surface. An optoelectronic component is arranged at or near the bottom surface, and an aperture is arranged at the upper surface, so that the lens is arranged between the optoelectronic component and the aperture. Widths of the lens that are defined in a specified lateral direction decrease from a maximal width at or near the bottom surface to a non-vanishing minimal width at the upper surface. The entire lens may be tapered.

SUMMARY OF THE INVENTION

The arrangement of an aperture and a filter region for sensor devices comprises a filter region provided to filter electromagnetic radiation, a shielding component provided to inhibit propagation of electromagnetic radiation, and an aperture of the shielding component. The filter region comprises a central filter region and a peripheral filter region, which are separate from one another and provided with differently designed filters for individual sensor regions. The aperture is arranged above the central filter region.

In embodiments of the arrangement, the peripheral filter region surrounds the central filter region at a distance from the central filter region. The central filter region and the peripheral filter region may be symmetrical with respect to rotations. In particular, they may be limited by regular polygons.

In further embodiments of the arrangement, the central filter region has an infrared cut-off wavelength for normal incidence, and the peripheral filter region has a different infrared cut-off wavelength for normal incidence. In particular, the cut-off wavelength for normal incidence onto the central filter region may be the same as the cut-off wavelength for inclined incidence at a selected angle of incidence onto the peripheral filter region.

Further embodiments of the arrangement comprise a further aperture of the shielding component, the aperture and the further aperture being separated from one another by an intermediate portion of the shielding component, the further aperture surrounding the aperture. The aperture and the further aperture may be symmetrical with respect to rotations. In particular, they may be limited by regular polygons.

In further embodiments of the arrangement, at least one of the central filter region and the peripheral filter region is divided into partial areas each of which is clear or provided with a filter selected from the group consisting of red filter, green filter, blue filter and infrared filter. In particular, the partial areas may each be arranged within one of a plurality of circular sectors of the filter region that do not overlap.

The filter sensor device comprises a body, an integrated circuit in the body, a sensor region, a filter region provided to filter electromagnetic radiation, the filter region being arranged above the sensor region, a shielding component provided to inhibit propagation of electromagnetic radiation, and an aperture of the shielding component. The filter region comprises a central filter region and a separate peripheral filter region, which are provided for individual measurements in a central sensor region and a peripheral sensor region. The aperture is arranged above the central filter region. The central filter region and the peripheral filter region may be symmetrical with respect to rotations, and their areas may in particular be limited by regular polygons.

Embodiments of the filter sensor device comprise a further aperture of the shielding component, the aperture and the further aperture being separated from one another by an intermediate portion of the shielding component, the further aperture surrounding the aperture.

In further embodiments of the filter sensor device, the body comprises a semiconductor material, and components of the integrated circuit and the sensor region are formed in the semiconductor material.

In further embodiments of the filter sensor device, the central filter region has an infrared cut-off wavelength for normal incidence, and the peripheral filter region has a different infrared cut-off wavelength for normal incidence.

In further embodiments of the filter sensor device, at least one of the central filter region and the peripheral filter region is divided into partial areas each of which is clear or provided with a filter selected from the group consisting of red filter, green filter, blue filter and infrared filter.

The following is a more detailed description of the arrangement of an aperture and a filter region and the filter sensor device with reference to the accompanying figures.

DETAILED DESCRIPTION

Figure 1:
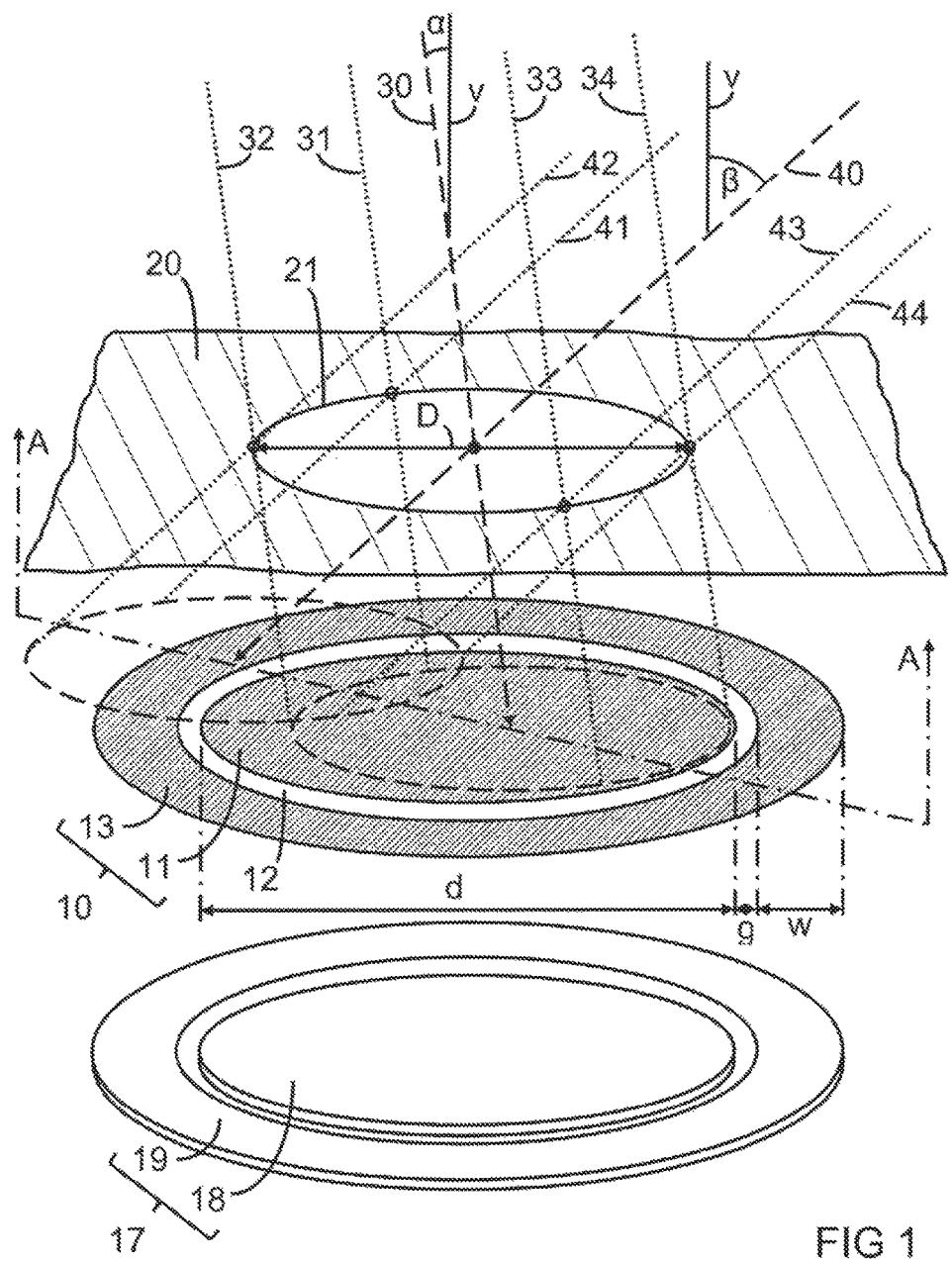
FIG. 1 shows an arrangement of an aperture, a filter region and a sensor region.

FIG. 1 shows an arrangement of an aperture, a filter region and a sensor region in a perspective view. The filter region 10 comprises a central filter region 11 and a peripheral filter region 13, which are separated by a gap 12 in between. The filter region 10 is arranged on or above the sensor region 17, which is provided for spatially individual measurements using a central sensor region 18 and a peripheral sensor region 19. A shielding component 20 comprising an aperture 21 is arranged above the filter region 10, so that the aperture 21 is placed above the central filter region 11.

FIG. 1 indicates the diameter D of the aperture 21, the diameter d of the central filter region 11, the width g of the gap 12 between the central filter region 11 and the peripheral filter region 13, and the width w of the peripheral filter region 13. The boundaries of the aperture 21, the central filter region 11 and the peripheral filter region 13 may be circular, for instance. In particular, the boundaries of the central filter region 11 and the peripheral filter region 13 may be concentric circles.

FIG. 1 shows two incident central rays 30, 40, which pass the center of the aperture 21, and their angles of incidence α and β with respect to the vertical direction v, which is normal to the plane of the filter region 10. The angle of incidence α of the central ray 30 is smaller than the angle of incidence β of the central ray 40, by way of example. Four peripheral rays 31, 32, 33, 34, 41, 42, 43, 44, which pass four selected points at the edge of the aperture 21, are shown for each central ray 30, 40. The projections of the area of the aperture 21 onto the filter region 10 in the directions of the central rays 30, 40 are indicated by broken elliptical contours.

Figure 2:
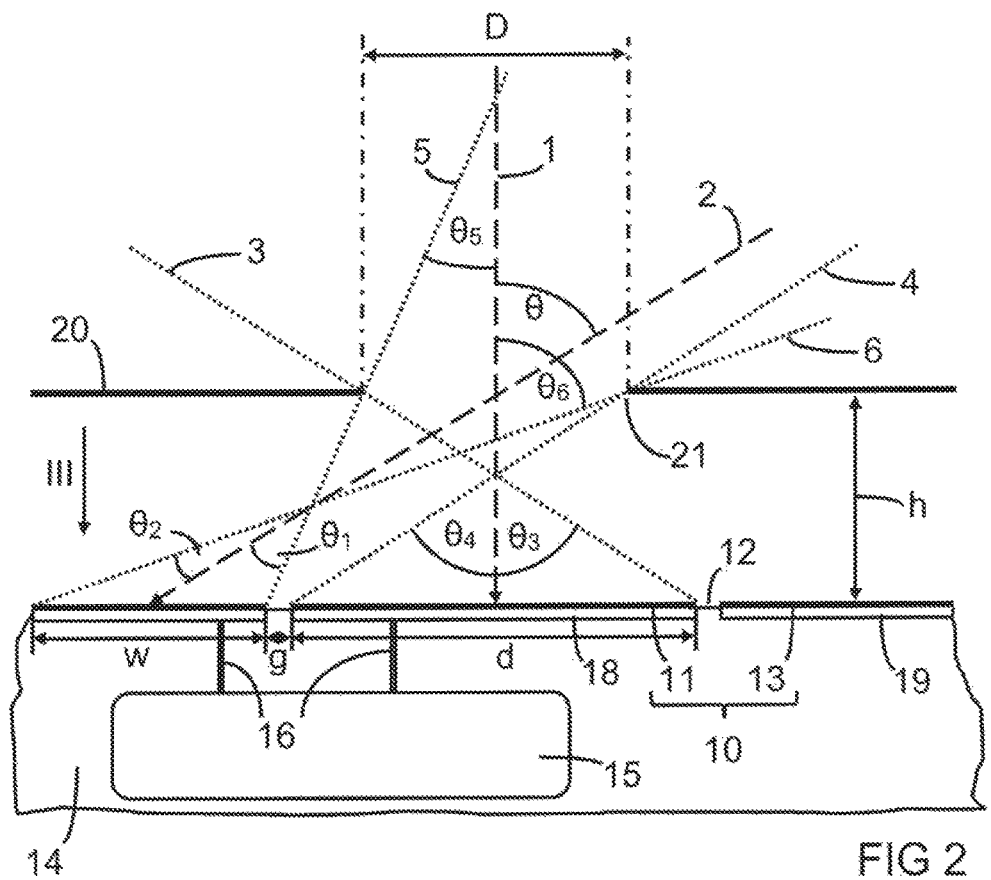
FIG. 2 shows the cross section indicated in FIG. 1.

FIG. 2 is a schematical cross section of a filter sensor device comprising the elements shown in FIG. 1. The line of section is indicated in FIG. 1 with letter A. The elements of FIG. 2 that are similar to corresponding elements of FIG. 1 are designated with the same reference numerals. Further to the dimensions indicated in FIG. 1, FIG. 2 shows the height h of the aperture 21 above the filter region 10, i. e. the distance between the plane of the filter region 10 and the shielding component 20.

The filter sensor device shown in FIG. 2 may include a body 14, which may especially comprise semiconductor material. An integrated circuit 15 may be provided in the body 14 for the operation of the sensor, especially for the performance and/or the evaluation of the measurements. Components of the integrated circuit 15 may be semiconductor devices. Electric interconnections 16 like a wiring, for instance, may be provided between the integrated circuit 15 and the central and peripheral sensor regions 18, 19, corresponding to the central filter region 11 and the peripheral filter region 13, respectively.

In FIG. 2, the central and peripheral sensor regions 18, 19 are schematically represented adjacent to the filter region 10. They may instead be arranged at a distance from the filter region 10. The central and peripheral sensor regions 18, 19 may especially form part of the integrated circuit 15.

FIG. 2 shows two incident central rays 1, 2, which pass the center of the aperture 21. Ray 1 is perpendicular to the plane of the filter region 10 and hence impinges on the center of the central filter region 11. Rays 3 and 4 define limit paths from opposite points at the edge of the aperture 21 to the farthest points at the boundary of the central filter region 11. The angles of incidence $\theta_3$ and $\theta_4$ of rays 3 and 4 are equal because of the symmetry of their directions with respect to ray 1. These angles of incidence $\theta_3$ and $\theta_4$ are maximal for the central filter region 11.

FIG. 2 shows the direction of ray 2 inclined with respect to the normal to the plane of the filter region 10. The angle of incidence $\theta > 0$ of ray 2 is sufficiently large to make ray 2 impinge on the peripheral filter region 13. Its target point is at equal distances from the concentric circles defining the inner and outer boundaries of the annular peripheral filter region 13 in this embodiment. Ray 5 at the angle of incidence $\theta_5$ defines the limit path from one of the points at the edge of the aperture 21 to the nearest target point at the inner boundary of the peripheral filter region 13. Ray 6 at the angle of incidence $\theta_6$ defines the limit path from the opposite point at the edge of the aperture 21 to the farthest point at the outer boundary of the peripheral filter region 13. The rays 2, 5 and 6 intersect between the aperture 21 and the peripheral filter region 13. $\theta_1$ and $\theta_2$ are the maximal deviations from the angle of incidence $\theta$ of ray 2. The following equations for $\theta_1$ and $\theta_2$ are read from FIG. 2: $\theta_k = (-1)^k \{\arctan[\tan\theta + (-1)^k(w+D)(2h)] - \theta\}$, where k is either 1 or 2, and $\tan\theta = (\frac{1}{2}w + g + \frac{1}{2}d)/h$. In this embodiment the peripheral filter region 13 is arranged for angles of incidence in the range from $\theta_5 = \theta - \theta_1$ to $\theta_6 = \theta + \theta_2$.

The central filter region 11 can be optimized for normal incidence (i. e. angle of incidence being equal to 0°). The peripheral filter region 13 can simultaneously be optimized for an angle of incidence θ that can be suitably selected different from zero. Examination of the wavelength shift versus angle of incidence shows the IR (infrared) cut-off wavelength of an IR filter to follow a quadratic relation. As an example, if the transition point (½ power point) of the IR filter characteristic is assumed to be at about 665 nm for normal incident light, the IR filter in the central filter region 11 may be designed with a 665 nm transition point. If the transition point is at about 635 nm for rays incident at an angle of 30°, for instance, the filter of the peripheral filter region 13 is designed to transition at the wavelength 665 nm+30 nm=695 nm for rays incident in the normal direction (zero angle of incidence). Thus the filter response is shifted to counteract the shift induced by the non-zero angle of incidence.

As a result, the filter of the peripheral filter region 13 thus adjusted will transition at about 665 nm as desired for light impinging at an angle of incidence of 30°. This is only one example for the filter design, which can be adapted to the requirements of individual embodiments of a filter sensor device. In this way sections of the filter region can be designed such that their characteristics are similar and/or appropriate although each section is illuminated with rays impinging at angles belonging to different ranges.

FIGS. 1 and 2 show an embodiment comprising two separate filter regions 11, 13. In further embodiments, the filter region 10 may comprise more than two separate filter regions. The separate filter regions can be arranged in different suitable ways. In particular, the filter region 10 may comprise a plurality of concentric annular filter regions, for example. The use of a small aperture 21 allows to limit the ranges of suitable angles of incidence, which are confined by minimal and maximal angles, like $\theta_5$ and $\theta_6$ in the above example. The filter arrangement may comprise infrared cut-off filters as described above. Instead or additionally, filter devices may employ color filters.

Figure 3:
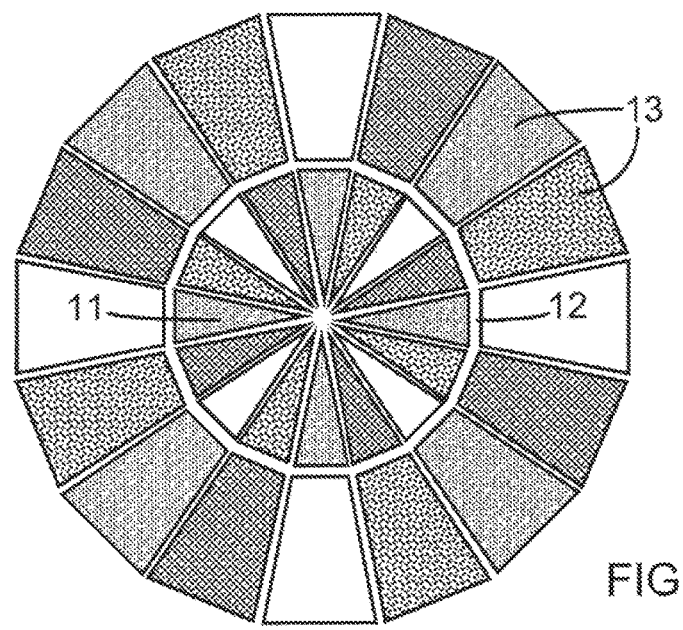
FIG. 3 shows an arrangement of partial areas of the filter region in a top view.

FIG. 3 is a top view in the direction indicated in FIG. 2 by the arrow pointing downwards. FIG. 3 depicts a typical array of color filters, which may correspond to an arrangement of individual sensor regions. The color filters may comprise different filter types, which may especially include absorptive organic filters and/or interference filters, for instance. FIG. 3 shows an array comprising four types of partial areas of the filter region 10, by way of example. Each of the partial areas may be clear, a red filter, a blue filter or a green filter, for instance. In the example of FIG. 3, the filter region 10 is divided into a plurality of circular sectors that do not overlap, and the partial areas are each arranged within one of the sectors.

In yet another embodiment each color filter could be an interference filter that filters a particular color and blocks infrared radiation. Instead of RGBC filters, an X, Y or Z tri-stimulus filter, which is known per se, can be employed. The clear filter may typically embody an IR cut filter to reject IR light. If the segmented array according to FIG. 3 is used, each of the filters in the peripheral filter region 13 may be shifted in terms of its design as described above, so as to provide the proper transition wavelengths for the particular nominal angle of incidence relevant to that filter region.

Figure 4:
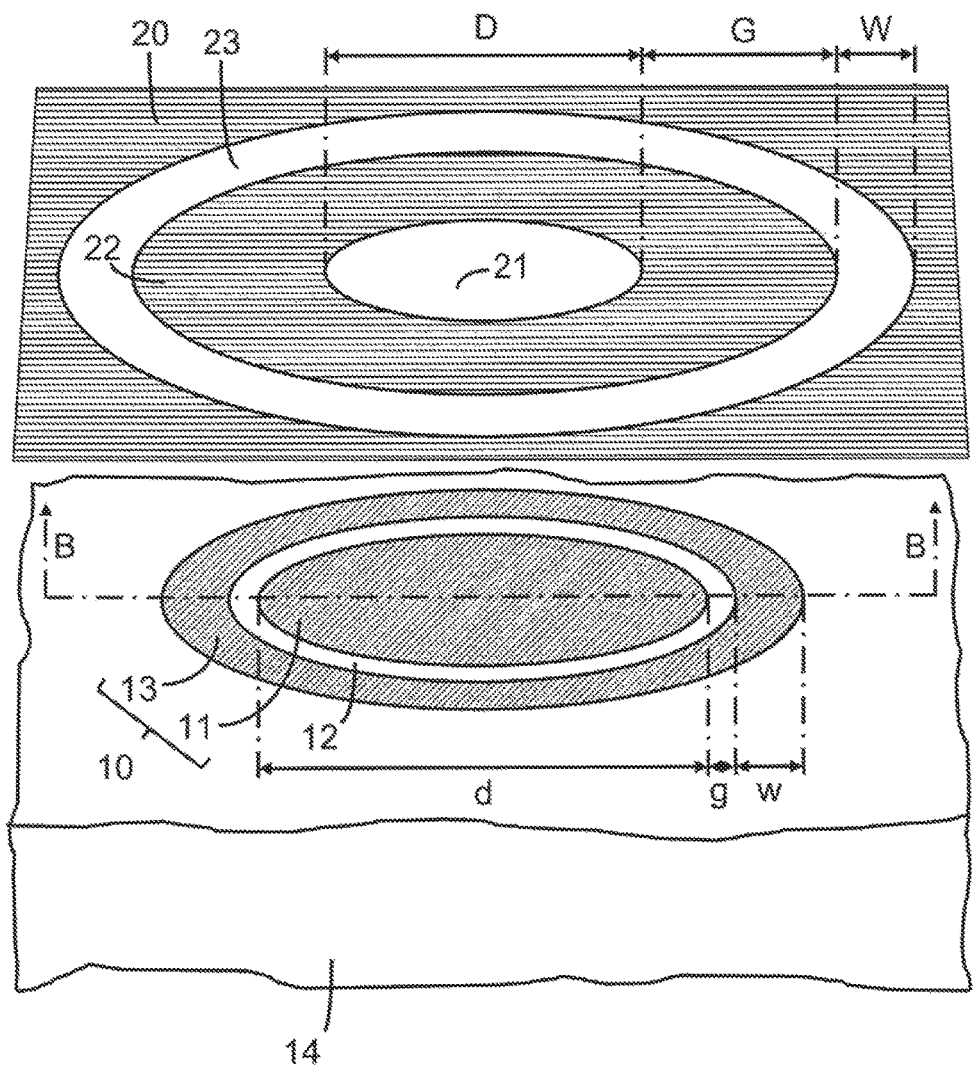
FIG. 4 shows a further arrangement of an aperture and a filter region.

FIG. 4 shows an arrangement according to FIG. 1 for a further embodiment.

Elements of the embodiment according to FIG. 4 that are similar to corresponding elements of the embodiment according to FIG. 1 are designated with the same reference numerals. The embodiment according to FIG. 4 comprises a central aperture 21 and a peripheral aperture 23 with an intermediate portion 22 of the shielding component 20 separating the apertures 21, 23. The peripheral aperture 23 may be an annular aperture, for instance. It is added to provide additional light gathering area for the peripheral filter region 13.

In the embodiment according to FIG. 4, the diameter D of the central aperture 21 is smaller than the diameter d of the central filter region 11. The width G of the intermediate portion 22 of the shielding component 20 between the apertures 21, 23 is larger than the width W of the peripheral aperture 23. The diameter of the inner boundary of the peripheral aperture 23, which is D+2G, is greater than the diameter of the outer boundary of the peripheral filter region 13, which is d+2g+2w. These dimensions may be adapted to the requirements of individual embodiments, so that the relations between the dimensions may differ from the embodiment according to FIG. 4.

Figure 5:
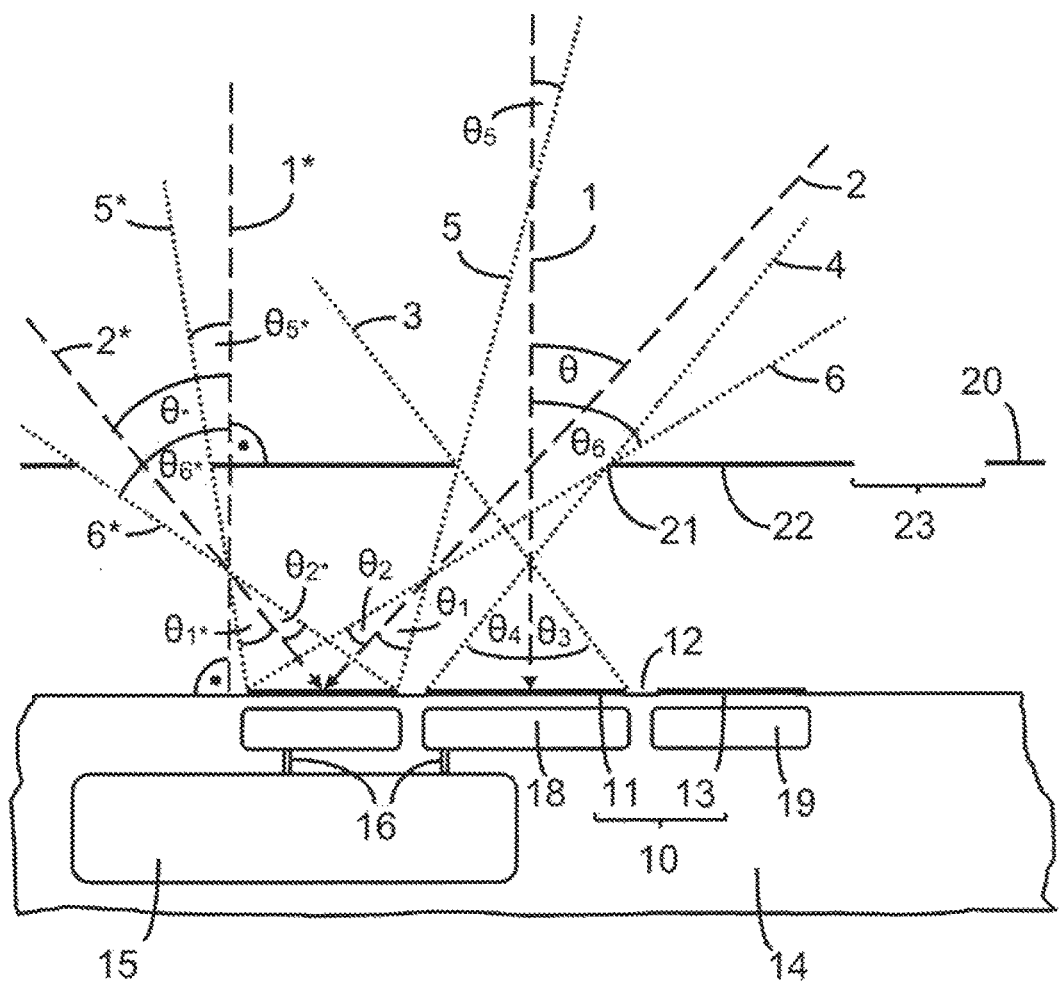
FIG. 5 shows the cross section indicated in FIG. 4.

FIG. 5 is a schematical cross section of a filter device comprising elements shown in FIGS. 2 and 4. The line of section is indicated in FIG. 4 with letter B. The elements of FIG. 5 that are similar to corresponding elements of FIGS. 2 and 4 are designated with the same reference numerals. The arrangement of the rays 2*, 5* and 6* with respect to the peripheral aperture 23 corresponds to the arrangement of the rays 2, 5 and 6 with respect to the central aperture 21. The respective angles of incidence are $\theta_*$, $\theta_{5*}=\theta^*-\theta_{1*}$ and $\theta_{6*}=\theta^*+\theta_{2*}$. In the embodiment according to FIG. 5, the arrangement of the peripheral filter region 13 and the peripheral aperture 23 is provided for a range of angles of incidence from $\theta_{5*}$ to $\theta_{6*}$.

The described arrangement of an aperture and a filter region comprising separate subregions has the advantage of reducing errors caused by different angles of incidence, in particular errors that are due to a shift of the transition wavelengths in interference filters. Different sensor regions may be employed for individual measurements using different filter characteristics. The division into different filter subregions allows to optimize the filters for either perpendicular or inclined incidence.

We claim:

1. An arrangement of an aperture and a filter region for a sensor device, comprising:
   a filter region provided to filter electromagnetic radiation;
   a shielding component provided to inhibit propagation of electromagnetic radiation;
   an aperture of the shielding component, the aperture being arranged above the filter region;
   the filter region comprising a central filter region and a peripheral filter region, which are separate from one another;
   the aperture being arranged above the central filter region;
   the central filter region and the peripheral filter region being provided with differently designed filters for individual sensor regions;
   the central filter region having a first cut-off wavelength for normal incidence;
   the peripheral filter region having a second cut-off wavelength for inclined incidence at a selected angle of incidence onto the peripheral filter region;
   the first cut-off wavelength being the same as the second cut-off wavelength;
   the peripheral filter region having a third cut-off wavelength for normal incidence; and
   the third cut-off wavelength being different from the first cut-off wavelength.

2. The arrangement according to claim 1, wherein the peripheral filter region completely surrounds the central filter region at a distance from the central filter region.

3. The arrangement according to claim 1, wherein
   the first cut-off wavelength is infrared; and
   the third cut-off wavelength is infrared.

4. The arrangement according to claim 1, further comprising:
   a further aperture of the shielding component;
   the aperture and the further aperture being separated from one another by an intermediate portion of the shielding component; and
   the further aperture surrounding the aperture.

5. The arrangement according to claim 4, wherein the aperture and the further aperture are symmetrical with respect to rotations.

6. The arrangement according to claim 1, wherein the filter region is symmetrical with respect to rotations.

7. The arrangement according to claim 6, further comprising:
   sectors of the filter region;
   at least one of the central filter region and the peripheral filter region being divided into partial areas each arranged within one of the sectors; and
   the partial areas being provided with different types of filters.

8. The arrangement according to claim 7, wherein the partial areas are clear or provided with a filter selected from the group consisting of red filter, green filter, blue filter and infrared filter.

9. A filter sensor device, comprising:
   a body;
   an integrated circuit in the body;
   a sensor region;
   a filter region provided to filter electromagnetic radiation, the filter region being arranged above the sensor region;
   a shielding component provided to inhibit propagation of electromagnetic radiation;
   an aperture of the shielding component, the aperture being arranged above the filter region;
   the filter region comprising a central filter region and a peripheral filter region, which are separate from one another;
   the aperture being arranged above the central filter region;
   the central filter region and the peripheral filter region being provided for individual measurements in a central sensor region and a peripheral sensor region of the sensor region;
   the central filter region having a first cut-off wavelength for normal incidence;
   the peripheral filter region having a second cut-off wavelength for inclined incidence at a selected angle of incidence onto the peripheral filter region;
   the first cut-off wavelength being the same as the second cut-off wavelength;
   the peripheral filter region having a third cut-off wavelength for normal incidence; and
   the third cut-off wavelength being different from the first cut-off wavelength.

10. The filter sensor device according to claim 9, wherein the central filter region and the peripheral filter region are symmetrical with respect to rotations.

11. The filter sensor device according to claim 9, further comprising:
a further aperture of the shielding component;
the aperture and the further aperture being separated from one another by an intermediate portion of the shielding component; and
the further aperture surrounding the aperture.

12. The filter sensor device according to claim 9, further comprising:
the body comprising a semiconductor material; and
components of the integrated circuit and the sensor region being formed in the semiconductor material.

13. The filter sensor device according to claim 9, wherein the first cut-off wavelength is infrared; and
the third cut-off wavelength is infrared.

14. The filter sensor device according to claim 9, wherein at least one of the central filter region and the peripheral filter region is divided into partial areas that are clear or provided with a filter selected from the group consisting of red filter, green filter, blue filter and infrared filter.

15. A semiconductor filter sensor device comprising:
the arrangement of the aperture and the filter region for the sensor device according to claim 1;
a sensor region, the central filter region being arranged above the sensor region; and
an aperture arranged above the central filter region.

16. The semiconductor filter sensor device of claim 15, further comprising:
a further aperture surrounding the aperture; and
the aperture and the further aperture being separated from one another by an intermediate portion of the shielding component.

17. The semiconductor filter sensor device of claim 15, wherein at least one of the central filter region and the peripheral filter region is divided into partial areas that are clear or provided with a filter selected from the group consisting of red filter, green filter, blue filter and infrared filter.

18. The filter sensor device according to claim 10, further comprising:
a further aperture of the shielding component;
the aperture and the further aperture being separated from one another by an intermediate portion of the shielding component; and
the further aperture surrounding the aperture.

19. The arrangement according to claim 1, wherein the filters are disposed directly on the sensor device.

20. The arrangement according to claim 1, wherein the aperture does not exhibit wavelength selectivity.

21. The filter sensor device according to claim 9, wherein the filter region is disposed directly on the sensor region.

22. The filter sensor device according to claim 9, wherein the aperture does not exhibit wavelength selectivity.

* * * * *